United States Patent [19]

Malloy

[11] Patent Number: 4,701,703
[45] Date of Patent: Oct. 20, 1987

[54] BED-OF-PINS TEST FIXTURE

[75] Inventor: James T. Malloy, Riverside, Calif.

[73] Assignee: Philip M. Hinderstein, Newport Beach, Calif. ; a part interest

[21] Appl. No.: 425,129

[22] Filed: Sep. 20, 1982

Related U.S. Application Data

[63] Continuation-in-part of Ser. No. 66,093, Aug. 13, 1979, Pat. No. 4,340,858.

[30] Foreign Application Priority Data

Mar. 5, 1982 [WO] PCT Int'l Appl. .................. PCT/US82/00269

[51] Int. Cl.$^4$ ........................ G01R 31/02; G01R 1/06
[52] U.S. Cl. ................. 324/158 F; 324/72.5; 324/73 PC; 324/158 P
[58] Field of Search ............... 324/158 P, 158 F, 72.5, 324/73 PC, 73 R; 339/17 L, 108 TP, 75 MP, 176 M, 176 MP

[56] References Cited

U.S. PATENT DOCUMENTS

| 2,923,911 | 2/1960 | Demurjian | 339/176 MP |
|---|---|---|---|
| 3,969,010 | 7/1976 | Nailor, III et al. | 339/176 MP |
| 4,087,747 | 5/1978 | Deegen et al. | 324/73 R |
| 4,119,357 | 10/1978 | Bonhomme | 339/75 MP |
| 4,183,609 | 1/1980 | Luna | 324/158 F |
| 4,267,506 | 5/1981 | Shiell | 324/158 P |
| 4,340,858 | 7/1982 | Malloy | 324/158 P |
| 4,362,991 | 12/1982 | Carbine | 324/158 F |
| 4,383,217 | 5/1983 | Shiell | 324/73 PC |
| 4,471,298 | 11/1984 | Frohlich | 324/158 P |

FOREIGN PATENT DOCUMENTS

| 785919 | 12/1980 | U.S.S.R. | 324/73 PC |

Primary Examiner—Ernest F. Karlsen
Attorney, Agent, or Firm—Whann & Connors

[57] ABSTRACT

An in-circuit test fixture for use in making a non-functional electrical inspection of individual components and/or circuit paths on a printed circuit board or wired backpanel assembly. The present in-circuit test fixture is cost effective and can be used when only small or moderate numbers of printed circuit boards have to be tested. The present test fixture eliminates the necessity for drilling holes in a support plate. Rather, a test head unit and a transition head unit are put together in modular fashion using assemblies which may be positioned in stacked arrays to provide a two-dimensional series of channels for support of pins to provide a test head for testing a two-dimensional product and to provide a two-dimensional series of channels for support of pins to provide a transition head for interconnection with an electronic circuit analyzer.

2 Claims, 14 Drawing Figures

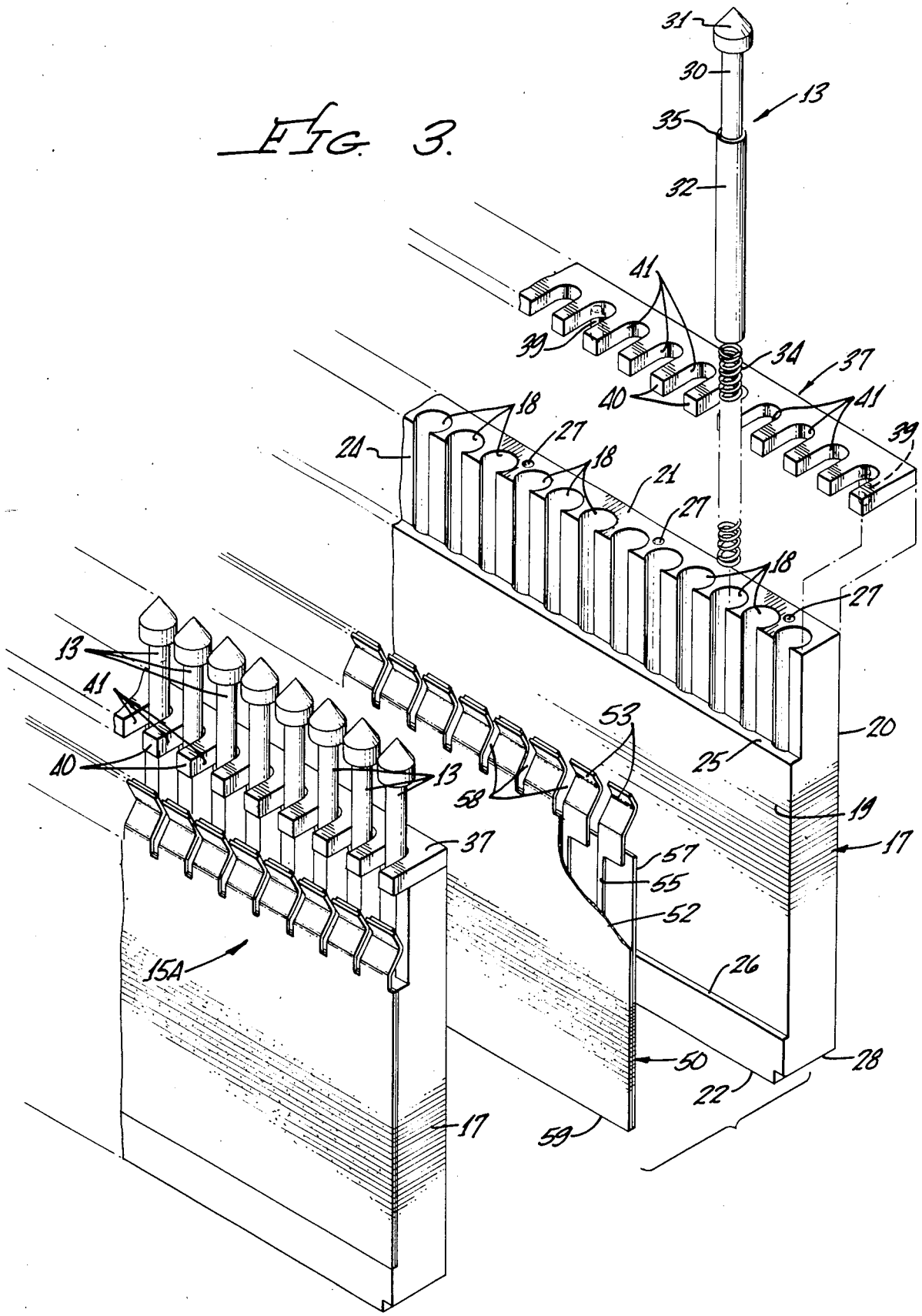

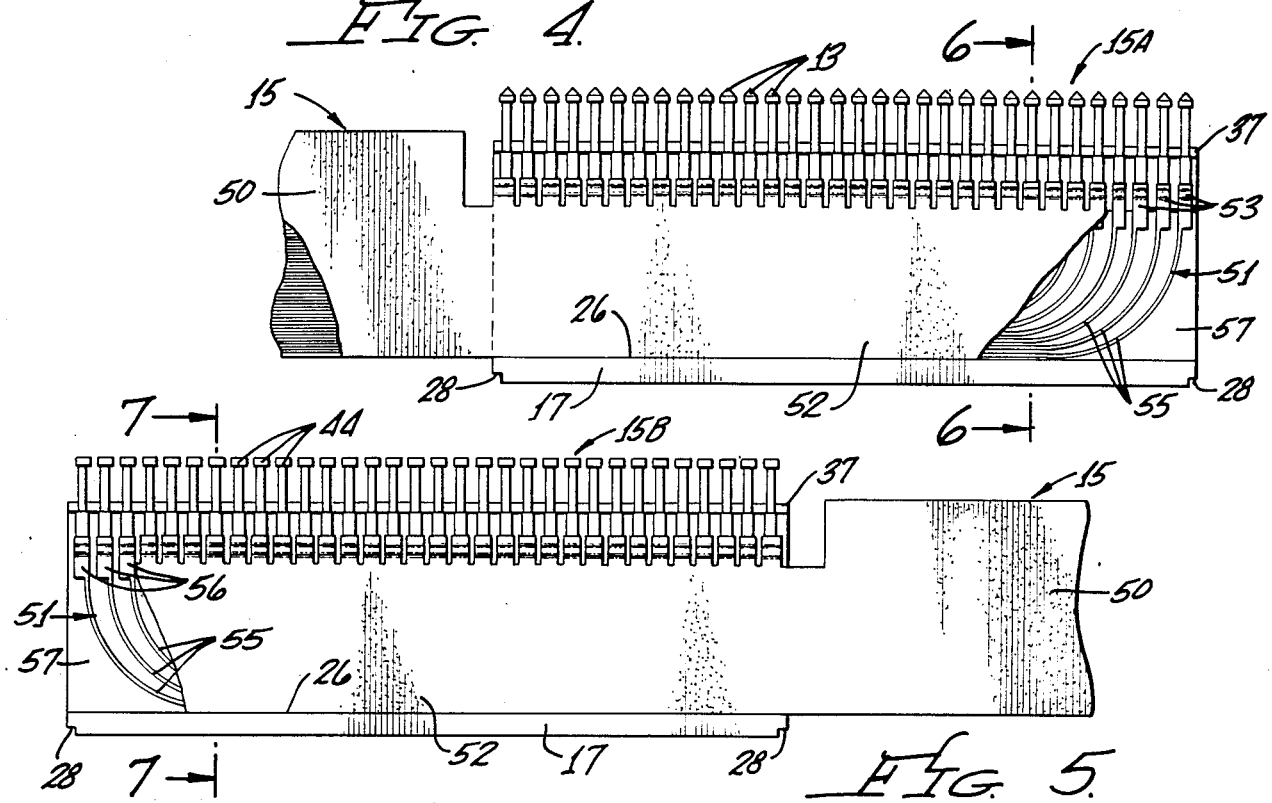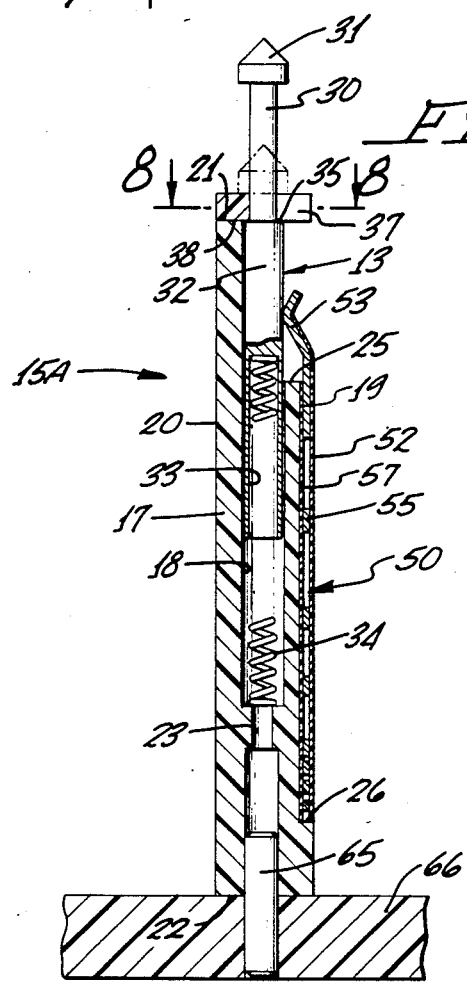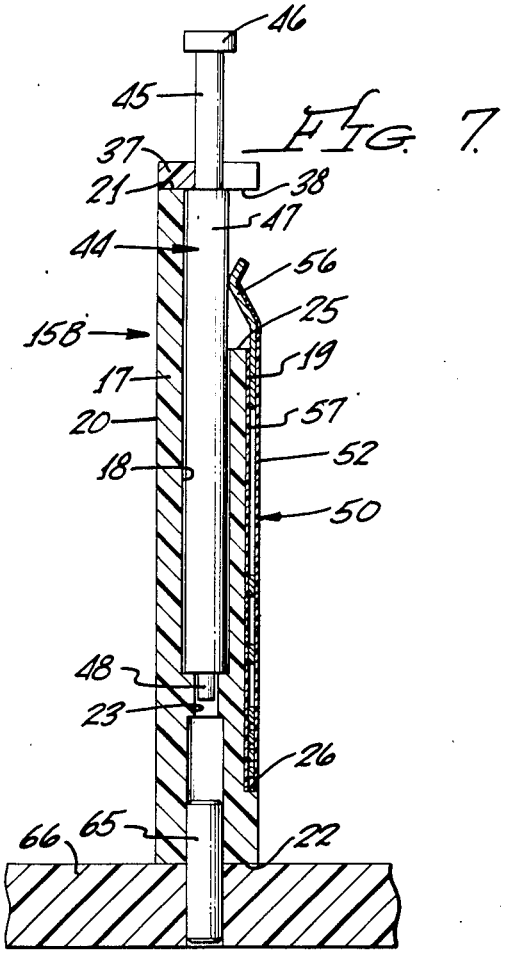

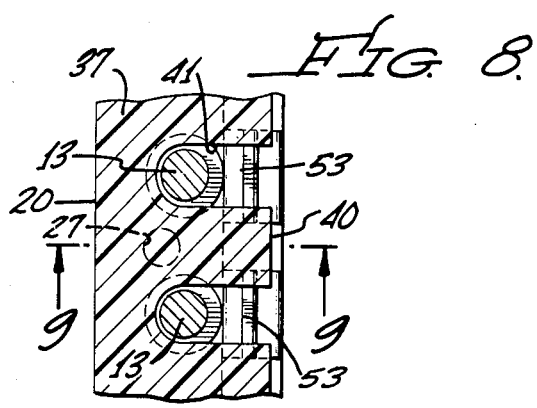
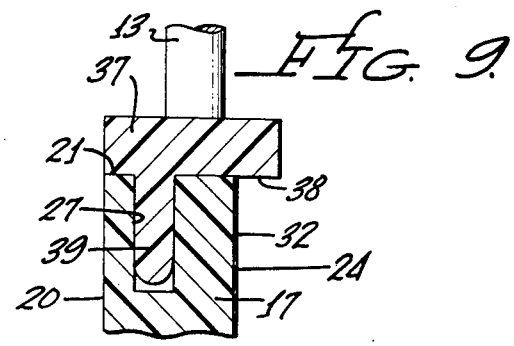
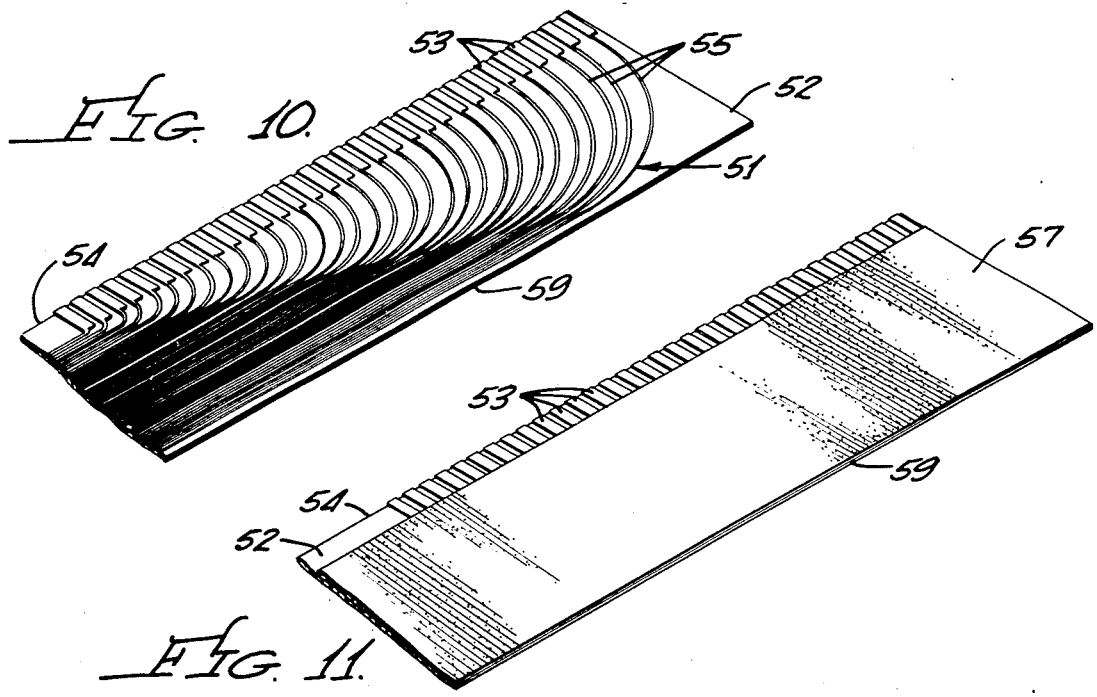
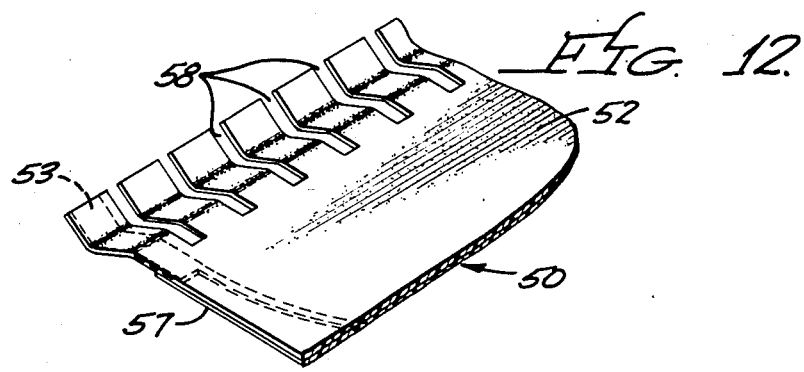

BED-OF-PINS TEST FIXTURE

BACKGROUND OF THE INVENTION

Related Applications

This application is a continuation-in-part application of U.S. Ser. No. 66,093, filed Aug. 13, 1979, and entitled Test Fixture, which has now issued as U.S. Pat. No. 4,340,858. This patent application U.S. Ser. No. 66,093 is incorporated herin by reference.

1. Field of the Invention

The present invention relates to a bed-of-pins test fixture and, more particularly, to an in-circuit test fixture for use in making a non-functional electrical inspection of individual components and/or circuit paths on a printed circuit board or wired backpanel assembly.

2. Description of the Prior Art

The present invention is concerned with the testing of printed circuit (PC) boards, primarily the testing of PC boards before and after the individual components have been mated thereonto and connected.

There are basically only two types of PC board testers, namely in-circuit and functional. All early automatic test systems were functional testers, i.e. connections were made only to the input and output terminals of the board and signals were conducted to the input terminals which simulated the input signals the PC board would experience in an assembled unit. The output terminals were monitored to determine whether or not the entire board was functioning properly.

While this approach was and still is very effective in separating good and defective PC boards, it is ineffective in isolating the cause of the test failure of defective boards. As a result, troubleshooting at a manual station is still required.

To overcome this shortcoming of functional testers, a totally different approach to PC board testing was developed, what is herein referred to as an in-circuit tester. The in-circuit tester does not approach testing on an input/ output basis. Rather, testing is achieved by making contact with each electrical point on a circuit board and sequentially monitoring each and every circuit component and each and every circuit path. In this manner, solder shorts, opens, missing parts, wrong parts, backwards or improperly seated parts, and out-of-tolerance parts may be isolated and identified.

A complete in-circuit test system includes a simple sequencer-type controller which switches from component to component on a PC board while monitoring that component's performance. Programming can be done very simply using microprocessors and/or minicomputers.

The most critical part of an in-circuit test system is the test fixture which must be configured for each part to be tested. The test fixture has the responsibility of making a reliable electrical connection from the controller to every node on the circuit board. This is typically done by using a bed of pressure pins that contact the foil side of the circuit board. A number of schemes exist for keeping the board in contact with the pins during test. This can be done manually or through the use of a vacuumactuated fixture, both of which are well known in the art and maintain and distribute a hold-down force evenly over the board.

A typical bed-of-pins fixture uses a blank panel with holes drilled on the same matrix as the PC board to be tested. The hole sizes are large enough to accommodate a sleeve which has a square tail extruded on the end for wire wrapping. A spring-loaded contact pin is inserted into the sleeve for making contact with the PC board. The fixture also has holes drilled on the other end of the board and solid feedthrough-type pins are installed which make contact with a transition head. The transition head usually has contacts which are the same as those which mate with the test PC board. The centers of the contacts on the transition head and feedthrough contacts on the interface part of the fixture are the same so that they will mate. Each sleeve is individually connected by an electrical lead to a corresponding solid pin.

The bed-of-pins test fixture provides a reliable method of testing for electrical defects. It provides the user with a simple and highly productive way of testing thousands of circuits in less than a minute in some instances. The main disadvantage with this system is cost. In most cases, a bed-of-pins fixture is cost prohibitive due to the high cost of the spring-loaded contacts and necessary accessories.

This being the case, the most widely used method of testing PC boards requires an operator to review a wire list or artwork to determine how the circuit should be connected. The operator must then proceed to touch a set of probes to all common circuits to verify their connection. The operator must also verify that circuits that are uncommon are not connected. A simple battery and light with positive and negative leads can be used and a buzzer is sometimes used as an ohmmeter. The disadvantages of this approach are great. Error is almost surely introduced by the operator. The time required to test a single circuit board is lengthy and the results of such test will always be open for criticism.

Since all of the systems for testing circuit boards have some disadvantage, it is very often the case that circuit boards are not tested prior to delivery to the customer. The user merely tries to use the board and work around problems, if possible. If the problems cannot be overcome, the circuit board is simply discarded and replaced.

In summary, all of the methods discussed above have one thing in common, i.e. they are cost prohibitive. Most cannot be used unless the quantities of product are large enough to support the large amounts of money required for necessary tooling. On the other hand, those not requiring high tooling costs, slow down production and result in high labor costs. The current testing methods, while adequate at times, do not meet industries needs most of the time. Thus, it becomes obvious that other, more economical, test methods must be created.

SUMMARY OF THE INVENTION

According to the present invention there is provided a bed-of-pins in-circuit test fixture which solves these problems in a manner unknown heretofore. The present incircuit test fixture is cost effective. It can be used when only small or moderate numbers of PC boards have to be tested. The present bed-of-pins test fixture eliminates the necessity of drilling holes in a support plate. The support plate is put together in modular fashion and highly simplified pins may be utilized.

Briefly, a test fixture constructed in accordance with the teachings of the present invention comprises an elongate generally rectangular housing made from an insulating material having a plurality of parallel, spaced, at least partially open-sided channels extending perpendicular to the longitudinal dimension thereof, one longitudinal side edge of the housing lying in a given plane, the ends of the channels in the plane being open; a plurality of spring-loaded conductive pins, individual ones of the pins being positioned in individual ones of the channels, the pins extending through the given plane; an elongate, generally rectangular sheet of flexible, insulating material positioned parallel to the housing and connected to the side thereof adjacent the open sides of the channels, one longitudinal side edge of the sheet being parallel to and adjacent the one side edge of the housing, the sheet including a pattern of electrical leads for conducting electrical signals to the pins; and a plurality of parallel, spaced contacts positioned along the one side edge of the sheet, the spacing between the contacts being the same as the spacing between the channels whereby a contact is aligned with each of the channels, each of the contacts being electrically connected to a different one of the electrical leads and being positioned to contact a different one of the pins for completing an electrical circuit therebetween.

According to a preferred embodiment of the invention, a cover is connectable to the one side edge of the housing for retaining the pins within the channels in the housing. Also, the sheet includes a series of parallel, spaced terminals positioned along an edge thereof remote from the plurality of contacts, the conductive leads connecting each of the contacts of the plurality of contacts to corresponding ones of the terminals of the plurality of terminals.

According to the preferred embodiment of the invention, the test fixture further comprises a second elongate, generally rectangular housing made from an insulating material having a plurality of parallel, spaced, at least partially open-sided channels extending perpendicular to the longitudinal dimension thereof, one longitudinal side edge of the second housing lying in a second given plane, the ends of the channels in the second plane being open; a second plurality of conductive pins, individual ones of the second plurality of pins being positioned in individual ones of the channels in the second housing, the pins extending through the second given plane, an end of the sheet remote from the end thereof which is connected to the first housing being positioned parallel to the second housing and being connected adjacent the open sides of the channels thereof, the same longitudinal side edge of the sheet being positioned parallel to and adjacent the one side edge of the second housing; and a second plurality of parallel, spaced contacts positioned along the side edge of the sheet, the spacing between the second contacts being the same as the spacing between the channels in the second housing whereby a second contact is aligned with each of the channels in the second housing, each of the second contacts being electrically connected to a different one of the electrical leads and being positioned to contact a different one of the second plurality of pins for completing an electrical circuit between the first and second plurality of pins.

OBJECTS, FEATURES AND ADVANTAGES

It is, therefore, the object of the present invention to solve the problems which heretofore prevented the manufacture of a cost effective, bed-of-pins type in-circuit test fixture. It is a feature of the present invention to solve these problems by the provision of a series of assemblies which permit the construction of a bed-of-pins type in-circuit test fixture in modular fashion. An advantage to be derived is a bed-of-pins fixture which does not require holes to be drilled. Another advantage is a bed-of-pins fixture which does not require wire wrapping. Still another advantage is a bed-of-pins fixture which does not require individual connection of a spring contact in the test fixture with a contact in a transition head. A still further advantage is that a manufacturer can draw on premolded compartments of various grids and can fashion fixtures of any design at will.

It is another feature of the present invention to solve these problems by the provision of a novel construction of flexible circuit for interconnecting a test head and a transition head. It is still another feature of the present invention to solve these problems by the provision of a novel means of mounting said assemblies.

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like or corresponding parts in the several figures and wherein:

BRIEF DESCRIPTION OF THE DRAWINGS

FIG. 3 is an enlarged, exploded, perspective view of a portion of test head of FIG. 1;

FIG. 4 an enlarged plan view of the test head unit of the assembly of FIG. 2;

FIG. 5 an enlarged plan view of the transition head unit of the of FIG. 2;

FIGS. 6 and 7 are enlarged sectional views taken along the lines 6—6 and 7—7, respectively, in FIGS. 4 and 5, respectively, and further showing the test head unit and the transition head unit mounted on a base as shown in FIG. 14;

FIG. 8 an enlarged sectional view taken along the line 8—8 in 6;

FIG. 9 a sectional view taken along the line 9—9 in FIG. 8; ,

FIGS. 10, 11 and 12 are a series of partial perspective views showing the sequence of manufacturing the flexible circuit means the assembly of FIG. 2.

DESCRIPTION OF THE PREFERRED EMBODIMENTS

Figure 1:
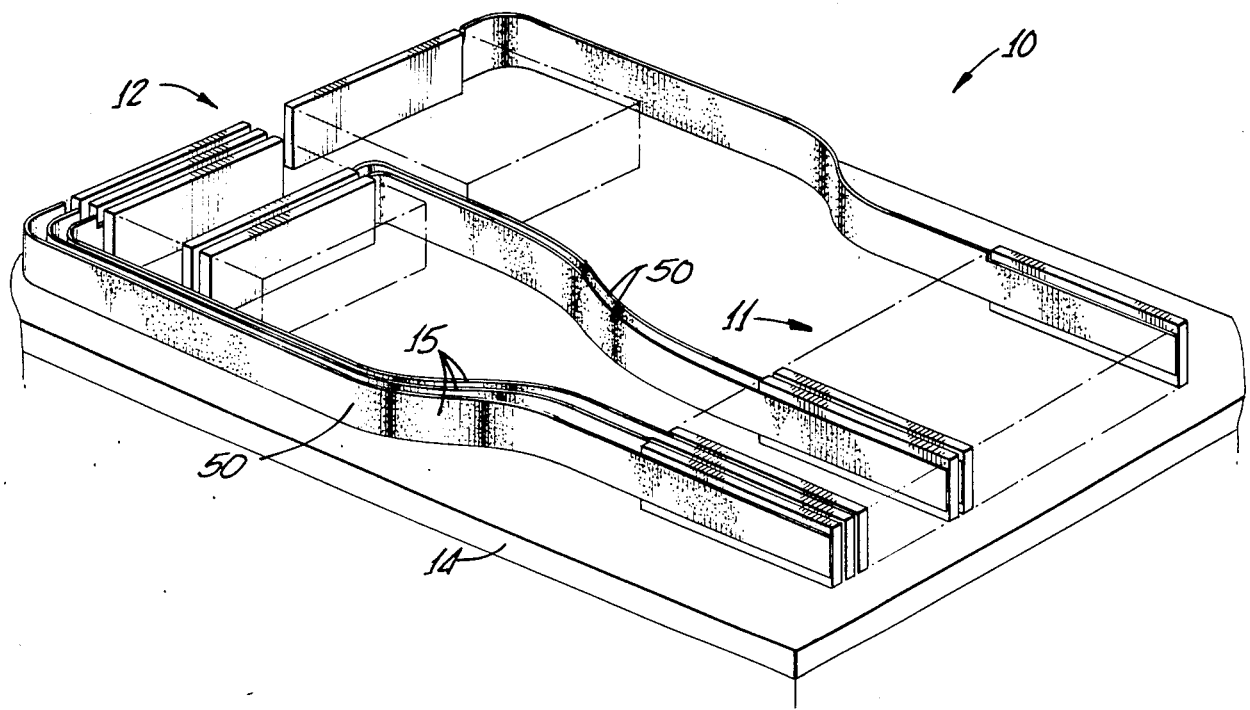
FIG. 1 is a perspective view of a bed-of-pins type in-circuit test fixture, including a test head and a transition head, constructed in accordance with the teachings of the present invention.
Figure 2:
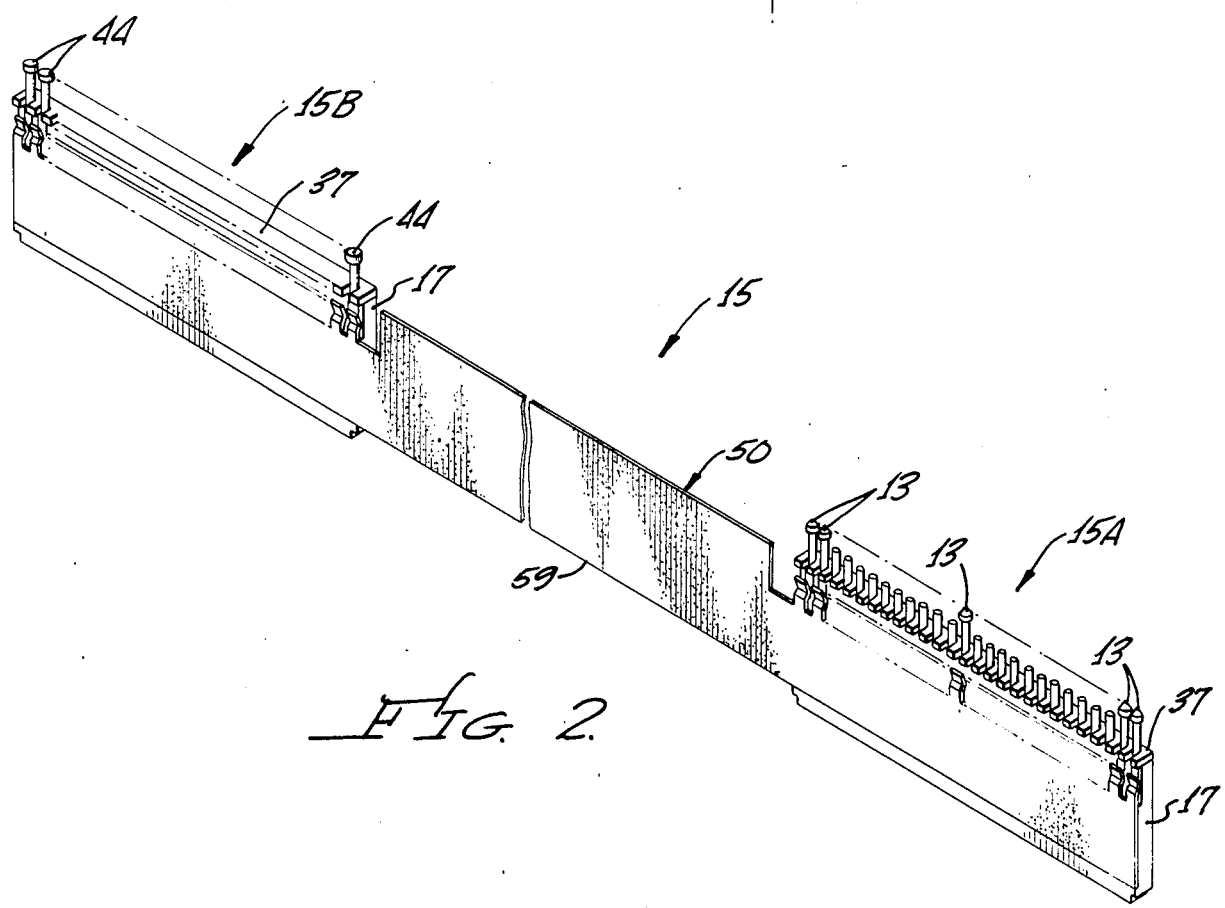
FIG. 2 is an enlarged perspective view of an assembly which forms the individual elements of the test fixture of FIG. 1.

Referring now to the drawings and, more particularly, to FIGS. 1-9 thereof, there is shown an in-circuit test fixture, generally designated 10, for testing loaded and/or unloaded PC boards (not shown). According to the preferred embodiment of the present invention, test fixture 10 includes a bed-of-pins test head, generally designated 11, for contacting the PC board, and a transition head, generally designated 12, for contacting an electronic circuit analyzer. Test fixture 10 is for use in a conventional in-circuit test system including a sequencer/controller and means for holding a PC board against test head 11. Since these components of the test system are well known to those skilled in the art, they will not be discussed further herein.

Test head 11 is, generally speaking, of the bed-of-pins type in which a bed-of-pressure pins contact the non-component side of a PC board. That is, in common with other bed-of-pins test heads, test head 11 includes a bed-of-pins 13 (not shown in FIG. 1), first ends of which are adapted to contact a PC board, means for supporting pins 13, and means for making electrical connection thereto. However, this is where the similarity between test head 11 and prior art fixtures ends since significant improvements are made with regard to each of these components.

More specifically, test fixture 10 is constructed on a suitable base 14, to be described more fully hereinafter, in modular fashion, using a plurality of assemblies, generally designated 15, which function as building blocks to form a complete test fixture. Accordingly, prior to describing the manner in which assemblies 15 may be assembled to form a complete test fixture 10, the construction of assemblies 15 will be described in detail.

In a conventional test fixture, the pins are supported by drilling holes in a support plate on the same matrix as the PC board to be tested. With the present invention, through the use of assemblies 15, the necessity for drilling a board is eliminated.

Each assembly 15 includes a test head unit 15A and a transition head unit 15B. Each unit 15A and 15B includes a preferably identical housing 17 made from a suitable insulating material. Housings 17 are preferably injection molded from a suitable plastic material. Each housing 17 is an elongate, generally rectangular member having a series of parallel, spaced channels 18 which extend perpendicular to the longitudinal dimension thereof. As shown more clearly in FIGS. 3, 6 and 7, each housing 17 is a solid member having opposed side surfaces 19 and 20 and opposed top and bottom surfaces 21 and 22, respectively. Channels 18 extend between and parallel to surfaces 19 and 20 and are open at surface 21. Channels 18 may extend only partially through housing 17 and have closed bottom ends. However, for mounting purposes, as will be described more fully hereinafter, channels 18 preferably extend to surface 22. Also, channels 18 preferably have a reduced diameter section 23 near bottom surface 22.

Also as seen in FIG. 3, the sides of channels 18 are preferably entirely enclosed, except that a portion of each housing 17 is cut away, as shown at 24, removing a portion of side surface 19, adjacent top surface 21, to expose portions of the sides of all of channels 18. While cutaway section 24 may extend from surface 21 all the way to surface 22, having channels 18 only partially exposed on the sides thereof is preferable, for reasons which will appear more fully hereinafter. In any event, cutting a portion of housing 17 away, as shown at 24, forms a ledge 25 in surface 19. An additional ledge 26 is formed in surface 19, by an offset portion thereof, adjacent bottom surface 22, also for reasons which will appear more fully hereinafter.

Top surface 21 of each housing 17 has a plurality of spaced holes 27 therein, which extend parallel to and between channels 18. There is no necessity for a hole 27 between each channel 18, only a few holes 27 extending along top surface 21 being required. There is also a groove 28 at either end of the base of each housing 17, at the intersection between bottom surface 22 and the end walls of housing 17, for reasons which will appear more fully hereinafter.

Housings 17 of units 15A are adapted for receipt of spring-loaded pins 13. As shown most clearly in FIGS. 3 and 6, each pin 13 includes a solid shaft 30 having a head 31 at one end thereof which may be of any type suitable for making contact with a PC board. The other end of shaft 30 is connected to one end of an increased diameter shaft 32, the other end of which is hollow to form an internal channel 33. Channel 33 receives one end of a spring 34, the other end of which rests on the abutment formed between the upper end of channel 18 and reduced diameter section 23 thereof. This is one of the functions of reduced diameter section 23. The same function could be performed by closing the bottom ends of channels 18. The dimensions of pin 13 and spring 34 are such that spring 34 applies a longitudinal spring force to pin 13 to urge pin 13 in the direction of head 31 thereof. Furthermore, the dimensions of pin 13 and spring 34 are such that the ledge 35 between shafts 30 and 32 is normally held by spring 34 above top surface 21 of housing 17.

An alternative construction is to make shaft 32 a solid member and to taper it from the one end to the other end thereof. In such a construction, the diameter of the other end of shaft 32 would be smaller than the inside diameter of spring 34 so as to extend thereinto. This arrangement would suitably interconnect pin 13 and spring 34 without the necessity of making pin 13 with a hollow shaft.

In order to hold pins 13 and springs 34 in tension and in place in housing 17 of test head unit 15A, each unit 15A includes a cover, generally designated 37. Each cover 37 is an elongate, generally rectangular, generally planar member, having a lower surface 38 which is adapted to be brought into contact with top surface 21 of housing 17.

As shown most clearly in FIGS. 3 and 6–9, each cover 37 has a plurality of cylindrical protrusions 39 extending from surface 38, perpendicular thereto, the spacing between adjacent protrusions 39 being the same as the spacing between adjacent holes 27 in housing 17. Furthermore, the diameter of protrusions 39 is approximately the same as the diameters of holes 27 so that a relatively tight, friction fit is achieved.

One side 40 of cover 37 has a series of parallel, U-shaped slots 41 therein which extend perpendicular to the longitudinal dimension of cover 37. The spacing between slots 41 is the same as the spacing between channels 18 so that the former are aligned with the latter. The spacing between the sides of slots 41 is greater than the diameter of shaft 30 of pin 13 but less than the diameter of shaft 32 of pin 13. Thus, with a pin 13 and a spring 34 positioned in each of channels 18 in housing 17 of test head unit 15A, cover 37 may be positioned above top surface 21 of housing 17 so that each slot 41 straddles a shaft 30 of a corresponding pin 13. As cover 37 is moved downwardly to cause protrusions 39 to enter holes 27, springs 34 begin to become compressed. With the final downward movement of cover 37 to the position shown in FIGS. 6, 8 and 9, springs 34 are compressed, ledges 35 of pins 13 are brought into a position coplanar with top surface 21 of housing 17, and protrusions 39 are firmly seated in holes 27. In this position, each pin 13 is securely held in its corresponding channel 18 and is placed in tension. As seen in FIG. 6, the lengths of shafts 30 are such that pins 13 are free to move from the position shown in solid lines in FIG.

6 to the position shown in phantom as pins 13 of test head unit 15A are brought into contact with a PC board to be tested.

The above-described construction of housing 17, pins 13 and cover 37 applies in its entirety only to test head unit 15A of assembly 15. Transition head unit 15B of assembly 15 is fundamentally similar. That is, test head unit 15B includes an identical housing 17 and an identical cover 37. The only difference is that it is probably not necessary to provide transition head 12 with spring-loaded pins. Thus, unit 15B of assembly 15 may include a series of solid pins, generally designated 44, each of which includes a shaft 45, one end of which is connected to a head 46, the other end of which is connected to one end of an increased diameter shaft 47. The difference is that head 46 probably has a different configuration than head 31 and shaft 47 is a solid member. The other end of shaft 47 has a reduced diameter section 48 connected thereto which extends into reduced diameter section 23 of channel 18 for centering of pin 44 in channel 18. This is another function of reduced diameter section 23.

At this point it can be seen that a principal objection to conventional test fixtures is eliminated. With the present invention, the necessity for drilling a base board is eliminated. By using a series of preassembled housings 17 with pins 13 and 44 therein and retained by covers 37 and by stacking adjacent housings 17, as shoWn in FIG. 1, and as to be described more fully hereinafter, a test head 11 and a transition head 12 may be formed in modular fashion.

It is obvious that in order to complete a test fixture, electrical connection must be made to each of pins 13 and 44. With the present invention, the necessity of attaching a wire directly to each pin is eliminated by the use of a flexible circuit means, generally designated 50. An understanding of circuit means 50 may be gathered from an explanation of the method of manufacturing same.

Referring now to FIGS. 2 and 10-12, circuit means 50 is made by providing a series of circuit traces 51 on an elongate, generally rectangular, generally planar, flexible, insulating sheet 52. Sheet 52 is preferably a thin film of polyester or capton. Circuit traces 51 include a first plurality of parallel, spaced contacts 53 positioned along one longitudinal side edge 54 of sheet 52, adjacent one end thereof, and an identical series of parallel, spaced contacts 56 preferably positioned along side edge 54, adjacent the other end of sheet 52. The spacing between each contact 53 and each contact 56 is the same as the spacing between channels 18 so that eventually, a contact 53 and 56 will be aligned with each of channels 18 and each of the pins 13 or 44 therein. The circuit traces 51 also include a series of conductive lines 55, one conductive line 55 connecting one of contacts 53 to one of contacts 56.

In the preferred method of manufacturing flexible circuit means 50, spring quality berillium copper or phosphorous bronze is used to make circuit traces 51. A thin layer of this material is preferably laminated on one side of sheet 52 in a manner well known to those skilled in the art. Using well known photographic etching techniques, the undesired material is etched away to form the circuit pattern shown in FIGS. 4, 5 and 10. Because spring quality berillium copper or phosphorous bronze is very dense, it causes high resistance. To overcome this, circuit traces 51 are preferably plated with a soft copper strike or ductile nickel strike followed by a thin layer of gold. This allows electrons to flow more easily through circuit traces 51 and eliminates the high resistance.

After the printing, etching and plating operations are completed to provide a construction as shown in FIG. 10, another sheet 57 of flexible insulating material is put over circuit traces 51, as shown in FIG. 11. While the longitudinal dimension of sheet 57 is the same as the longitudinal dimension of sheet 52, the lateral dimension is smaller so that sheet 57 does not cover contacts 53 or 56. This is because it is this side of contacts 53 and 56 that will make electrical contact with pins 13 and 44, respectively. This can best be seen in FIGS. 3-7. In any event, after sheet 57 is laminated to sheet 52, each completed assembly is subjected to a blanking/forming operation in which a blanking tool is used to cut out the material in sheet 52 between each of contacts 53 and 56, as shown most clearly at 58 in FIG. 12. Each contact 53 and 56 is formed into a finger, preferably in the same operation, by the same blanking tool. When completed, the insulating material between the fingers has been cut away, at 58, allowing each finger separate independent action. When each finger is so formed, it becomes an independent single beam contact able to move independently of the other fingers.

At this time, it is possible to complete assembly 15. As shown most clearly in FIGS. 2-7, a completed flexible circuit means 50 is positioned so that the sides thereof adjacent the opposite ends thereof engage side surfaces 19 of opposed housing 17. Ledges 26 on housings 17 are provided for location purposes so that the side edge 59 of flexible circuit means 50 opposite to side edge 54 rests on ledge 26. This construction is clearly shown in FIGS. 2-5.

At this time, an adhesive material is applied between surfaces 19 of housings 17 and the portions of sheet 57 which engage surfaces 19 of housings 17. After the adhesive is applied, flexible circuit means 50 is positioned on ledges 26 so that the independent single beam contacts 53 and 56 can be aligned to their corresponding open channels 18. When flexible circuit means 50 is properly aligned to channels 18, it is pressed against surfaces 19 and bonded in place. It is also recognized that the same results are possible by sonically welding circuit means 50 to housing 17. In either event, the completed assembly is as shown in FIGS. 2-7. Each spring contact 53 engages the side of a pin 13 in a corresponding channel 18 in a housing 17 of a unit 15A and each spring contact 56 engages the side of a pin 44 in a corresponding channel 18 in a housing 17 of a unit 15B. Assembly 15 is now completed and a permanent electrical connection is formed between each sliding pin 13 and each stationary pin 44.

From an examination of FIGS. 6 and 7, it can be seen that by partially enclosing the sides of channels 18, pins 13 and 44 contact only spring contacts 53 and 56, respectively, above ledges 25, and there is no rubbing of pins 13 on sheet 57. From an inspection of FIGS. 6 and 7, it can also be seen that the outer surfaces of traces 51, including lines 55 and contacts 53 and 56, are totally insulated so that assemblies 15 may be positioned in side-by-side relationship, as shown generally in FIG. 1, and as will be described more fully hereinafter, to prevent short circuiting of adjacent circuit traces.

Returning now to FIG. 1, there is shown the general configuration of a test fixture 10 whereby a plurality of assemblies 15 are stacked with units 15A positioned to form a bed-of-pins test head 11 and units 15B positioned to form a transition head 12. This design allows the transmission of electrical signals from each pin 13 in test head 11 to a corresponding pin 44 in transition head 12. In this way, assemblies 15 simulate the common technique of connecting a wire from a test point on a test head to an interface point on an analyzer interface portion on a conventional system. This is clearly seen in FIG. 1. Units 15A are used to contact the circuit board under test. Signals are passed through the flexible circuit trace lines 55 to corresponding pins in units 15B. Transition head 12 is used to make contact with spring-loaded or solid pins in the analyzer's interface system. That is to say, when transition head 12 mates with the corresponding pins in an analyzer, it automatically makes an electrical connection. Because circuit means 50 is flexible, it can be placed in any desired configuration.

It should be recognized that assemblies 15 could be provided with test head units 15A only and that each circuit means 50 could terminate in a series of parallel, spaced terminals connected to lines 55, such terminals being spaced along any edge of sheet 52. Connection to these terminals could be made with an edge card connector or any other suitable technique.

Figure 13:
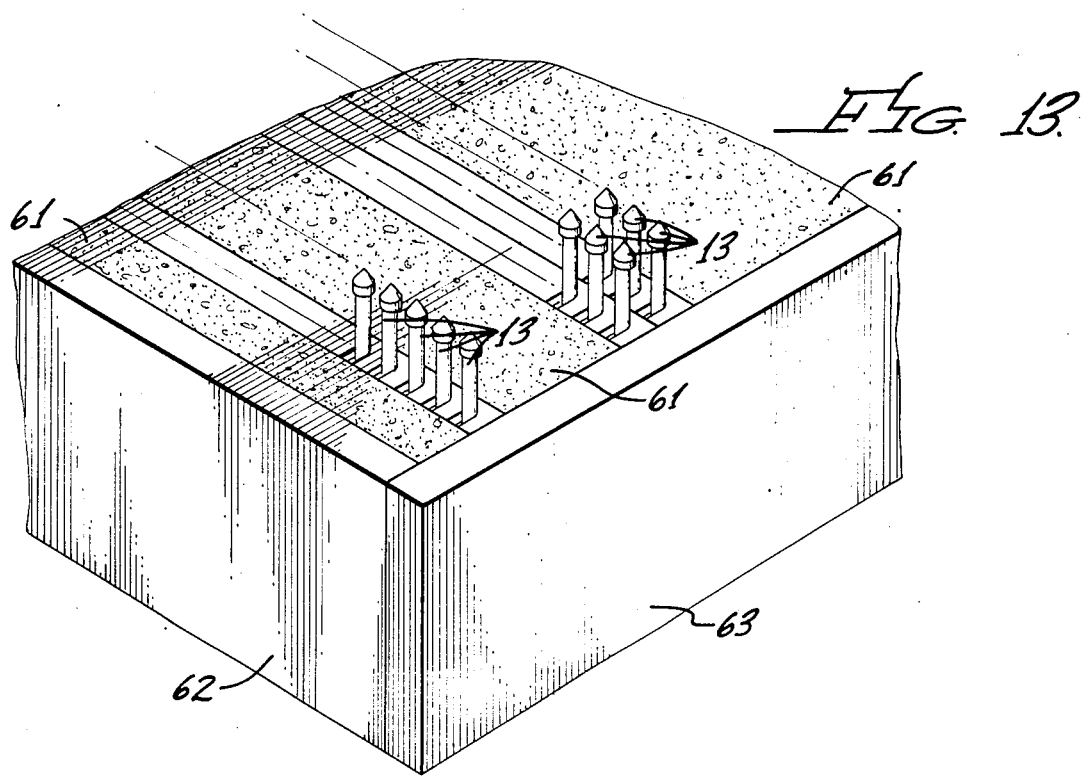
FIGS. 13 and 14 are partial perspective views of portions of test head units constructed in accordance with the teachings of the present invention showing the manner in which a test fixture may be assembled as described herein.

In order to form a two-dimensional array of pins 13 and 44 to form a bed-of-nails test head 11 and a transition head 12, respectively, it is necessary to support units 15A and 15B in parallel, spaced relationship, in a desired pattern. This may be achieved as shown in FIG. 13, for example, by the use of elongate spacer blocks 61 of various sizes to adjust the spacing between adjacent rows of units 15A or 15B or by not using spacer blocks 61 at all, if not required, so that adjacent units 15A or 15B are stacked one against each other. Such an arrangement is shown in FIG. 13. After the desired arrangement of units 15A or 15B is established by using any number of assemblies 15 and spacer blocks 61, the entire arrangement of either test head 11 or transition head 12 may be clamped together in a frame including multiple side panels, such as panels 62 and 63 shown in FIG. 13. These panels may be clamped together in any suitable manner.

Figure 14:
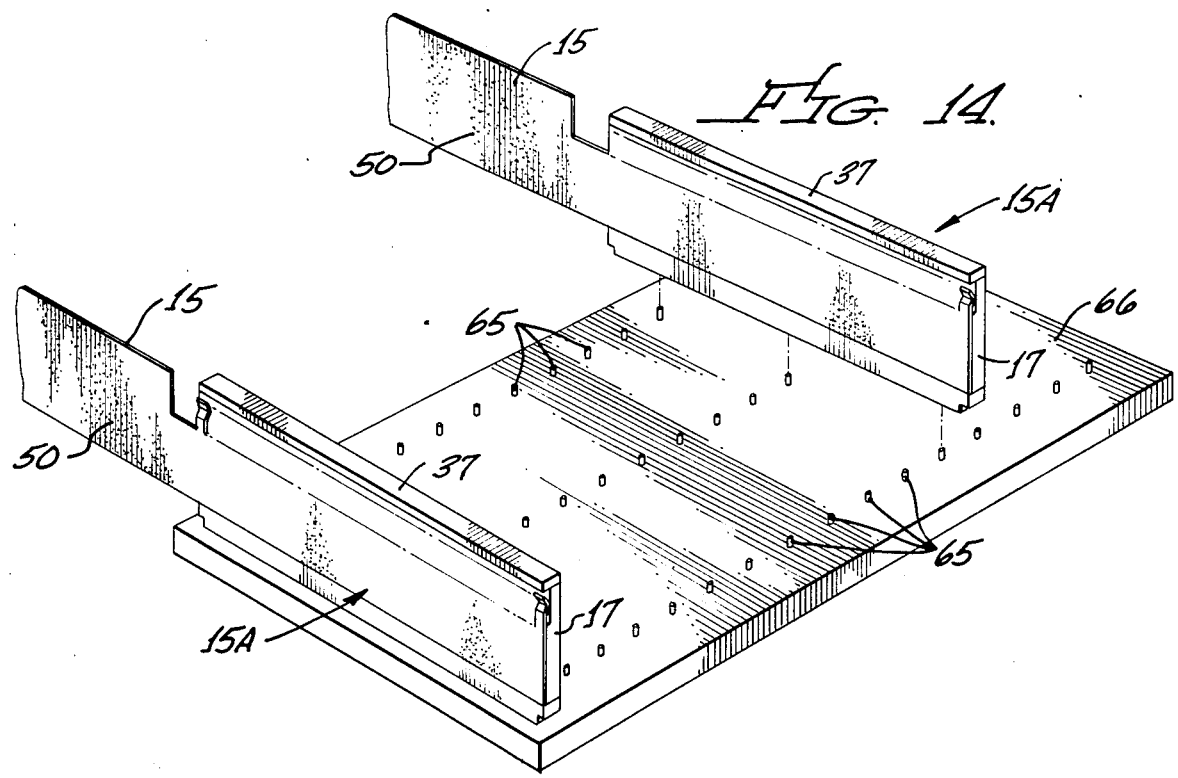

The use of spacer blocks 61 and a side panel frame is not the preferred method of assembling test head 11 and transition head 12. As shown in FIGS. 6, 7 and 14, the bottoms of channels 18, below reduced diameter sections 23, may be utilized for the mounting of housings 17. It has been found that by using a plurality of press-fit pins 65, which are either solid or split, positioned on a suitable base 66, spacer blocks and frames can be eliminated. That is, when two or three pins 65 are pressed half way into holes in base 66, pins 65 provide a rigid support for housings 17. All that is necessary is for housings 17 to be positioned as shown in FIGS. 6 and 7 so that pins 65 extend into selected ones of the bottoms of channels 18. Pins 65 are forced into the bottoms of channels 18 and housings 17 are pressed downwardly until bottom surfaces 22 engage the top surface of base 66. This establishes perpendicularity and pins 65 securely support housings 17.

It may be here mentioned that grooves 28 at the ends of housings 17 allow housings 17 to be pryed up from base 66 when removal is necessary. An L-shaped removal tool (not shown) can be inserted between the top of groove 28 and base 66 for the purpose of removing housings 17 for recovery. This allows assemblies 15 to be reused on other configured fixture devices. It also allows the user to replace defective assemblies 15 without major repair.

An advantage to the present invention is that the entire assembly of test head 11 and transition head 12 can be built on a single support plate 14, as is readily seen in FIG. 1. The support plate 14 with holes therein having press-fit pins 65 in such holes provides a ready base for installation of assemblies 15. The housings 17 are pressed over the protruding edges of pins 65 by pressing them into the bottoms of channels 18. Thus, a single support plate is all that is required.

Another advantage of the present system is that even a scrap circuit board can be used to provide a ready drill support plate, and this is what is shown in FIG. 14. (Pins 13 are omitted from FIG. 14 for clarity.) Base 66 is actually a scrap circuit board of the type test fixture 10 will be used to test. Pins 65 can be pressed into existing holes in the scrap circuit board. Housings 17 are pressed in place and the other ends are pressed and fastened to a support plate designed for the particular analyzer. These plates can then be attached to base 14 to form test fixture 10. This allows a test fixture to be built on a moments notice without drilling special holes to accommodate the design of a given circuit board. The interface portion on the support plate 14 is always the same for each given kind of system. Therefore, this end would be drilled and stacked that way.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:
1. For use in an automatic test system having the capability of electrically testing different types of generally planar boards, each type of board having a plurality of electrical test points arranged in a preselected pattern on a predetermined two dimensional grid,
   a test fixture including:
   a plurality of planar members;
   a plurality of modular housing components which are adapted to be stacked together in a side-to-side array;
   each housing component being made of an insulating material and having (a) a predetermined size and shape, including a planar top and wall elements, at least one wall element having therein a recess adapted to receive at least a portion of a planar member, and (b) a plurality of parallel compartments spaced apart in at least one row, said compartments terminating in open ends in said top of said housing component on said grid pattern,
   a plurality of conductive pin means, individual ones of said pin means being positioned in individual ones of said compartments so that one segment of each of said pin means extends outwardly from the open end of the compartment in which it is positioned and another segment of the pin means extends into the compartment in which it is positioned;
   spring means which urge said one segment of the pin means towards the selected board under the test, so that during testing electrical contact is made between said board under test and said pin means;

a plurality of electrical leads carried by said planar members, with individual ones of said leads being adapted to be connected electrically to individual ones of said pin means upon stacking of the planar members and housing components together in side-to-side array, means for supporting the housing components and the planar members in a stacked array with individual housing components arranged side-to-side, with individual planar members being between adjacent housing components with a portion of each of said individual planar members being received in individual recesses in the wall elements, so that the housing components, planar members, and pin means form the test fixture with the pin means being arranged in a pattern corresponding to the preselected pattern of the board under test with individual electrical leads being electrically connected to individual pins.

2. The test fixture of claim 1 including cover means for holding the pin means in position.

* * * * *